(12) United States Patent
Matsuda et al.

(10) Patent No.: US 12,255,087 B2
(45) Date of Patent: Mar. 18, 2025

(54) EXPANDING APPARATUS

(71) Applicant: DISCO CORPORATION, Tokyo (JP)

(72) Inventors: Tomohito Matsuda, Tokyo (JP); Yuhei Fujii, Tokyo (JP); Naoya Takesue, Tokyo (JP); Takayuki Masada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 345 days.

(21) Appl. No.: 18/071,014

(22) Filed: Nov. 29, 2022

(65) Prior Publication Data
US 2023/0170246 A1 Jun. 1, 2023

(30) Foreign Application Priority Data

Nov. 30, 2021 (JP) .................................. 2021-194780
Oct. 26, 2022 (JP) .................................. 2022-171425

(51) Int. Cl.
*H01L 21/683* (2006.01)
(52) U.S. Cl.
CPC .............................. *H01L 21/6836* (2013.01)

(58) Field of Classification Search
CPC .......... H01L 21/6836; H01L 21/67092; H01L 21/67109; H01L 21/67132; H01L 21/67028; H01L 21/67103
See application file for complete search history.

(56) References Cited

FOREIGN PATENT DOCUMENTS

JP  2021034397 A * 3/2021 ....... H01L 21/67092

OTHER PUBLICATIONS

English translation JP2021034397 (Year: 2021).*

\* cited by examiner

*Primary Examiner* — Jason L Vaughan
*Assistant Examiner* — Amanda Kreiling
(74) *Attorney, Agent, or Firm* — Greer Burns & Crain Ltd.

(57) ABSTRACT

An expanding apparatus includes a frame fixing part that fixes an annular frame of a workpiece unit, a holding table that holds a workpiece, an expanding unit that expands a sheet, a heating unit that heats the sheet between an outer circumferential side of the workpiece and an inner circumferential edge of the annular frame, and a cover that covers the workpiece held by the holding table. The cover covers the workpiece when the sheet is heated by the heating unit.

3 Claims, 8 Drawing Sheets

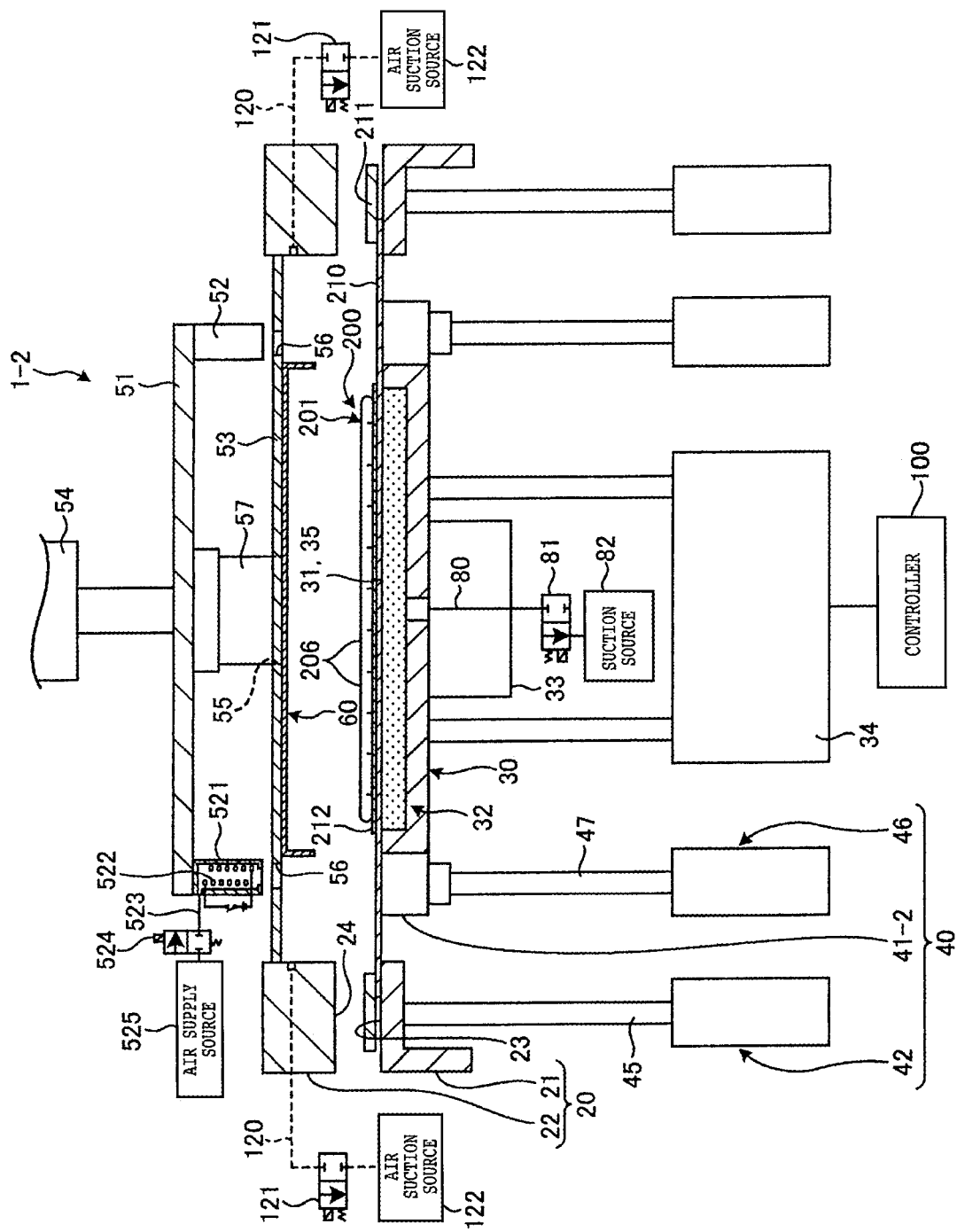

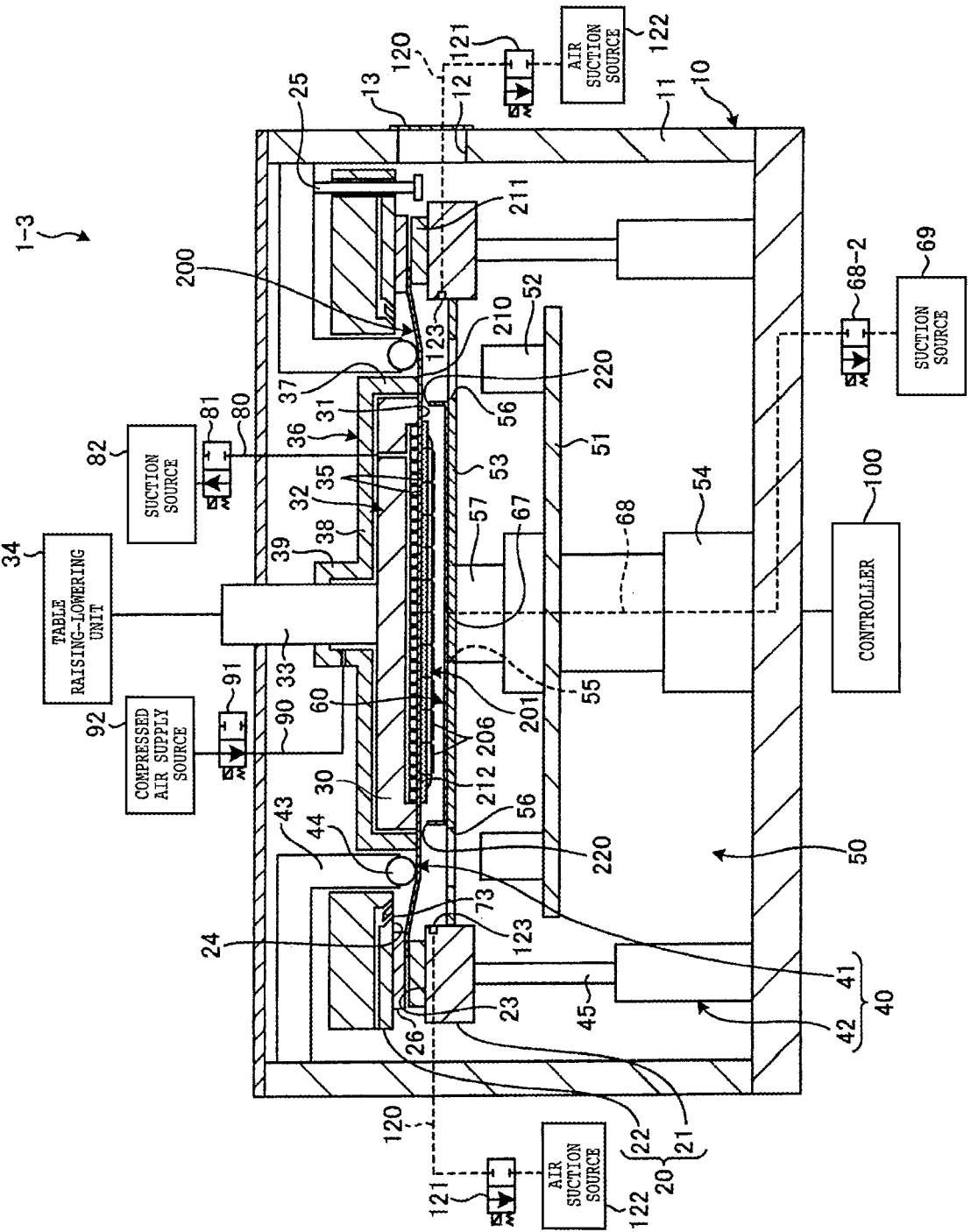

EXPANDING APPARATUS

BACKGROUND OF THE INVENTION

Field of the Invention

The present invention relates to an expanding apparatus that expands a sheet.

Description of the Related Art

A process has been known in which a workpiece in which division start points are formed is sticked to a sheet and the sheet is expanded to dice the workpiece into individual chips along the division start points and to widen an interval between adjacent ones of the chips or to widen the interval between adjacent ones of the chips in a case in which the workpiece has been already diced into the individual chips (for example, refer to Japanese Patent Laid-open No. 2021-034397).

SUMMARY OF THE INVENTION

When the sheet is expanded in an expanding apparatus described in Japanese Patent Laid-open No. 2021-034397, the interval between the chips is kept by blowing hot air of a heater over a loosened region in the sheet and shrinking the loosened region in the state in which the workpiece is held on a holding table after the expansion. However, there is a problem that mist, gas, and foreign matter such as dust are generated from the sheet due to heating of the sheet and adhere to the workpiece.

Also, a temperature of the holding table needs to be set low at a time of the expanding so that a die attach film (DAF) stacked on the sheet can be torn. Thus, when the holding table is heated by heat of the heater, a time of waiting until the temperature lowers occurs, which is inefficient.

Moreover, when the sheet shrinks due to the heating, there is a risk that the sheet is pulled by an outer circumferential part that has shrunk and comes off the holding table and the workpiece supported by the sheet cannot be normally sucked and held and the interval between the chips supported by the sheet spread as a result of expansion becomes smaller, and there is a risk that the chips move and collide to each other to become chipped.

Thus, an object of the present invention is to provide an expanding apparatus that can prevent such a risk that a holding table is heated and prevent such a risk that a sheet comes off the holding table, while preventing such a risk that foreign matters generated due to heating of the sheet adhere to a workpiece.

In accordance with an aspect of the present invention, there is provided an expanding apparatus that expands a sheet of a workpiece unit including a workpiece, the sheet stuck to the workpiece, and an annular frame to which an outer circumferential side of the sheet is stuck. The expanding apparatus includes a frame fixing part that fixes the annular frame of the workpiece unit, a holding table that holds the workpiece, an expanding unit that expands the sheet, a heating unit that heats the sheet between an outer circumferential side of the workpiece and an inner circumferential edge of the annular frame, and a cover that covers the workpiece held on the holding table. The cover covers the workpiece when the sheet is heated by the heating unit.

Preferably, a suction hole connected to an air suction source is formed in the frame fixing part, and the suction hole sucks sheet dust generated due to heating of the sheet. Preferably, the cover has a cover suction hole connected to a suction source.

The present invention can prevent such a risk that a holding table is heated and such a risk that a sheet comes off the holding table while preventing such a risk that foreign matter generated due to heating of the sheet adheres to a workpiece.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 8 is a sectional view schematically illustrating a configuration example of an expanding apparatus according to a modification example of the first embodiment; and FIG. 9 is a sectional view schematically illustrating a configuration example of an expanding apparatus according to a second embodiment.

DETAILED DESCRIPTION OF THE PREFERRED EMBODIMENTS

Embodiments of the present invention will be described in detail below with reference to the drawings. The present invention is not limited by contents described in the following embodiments. Also, what can easily be envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

First Embodiment

Figure 1:
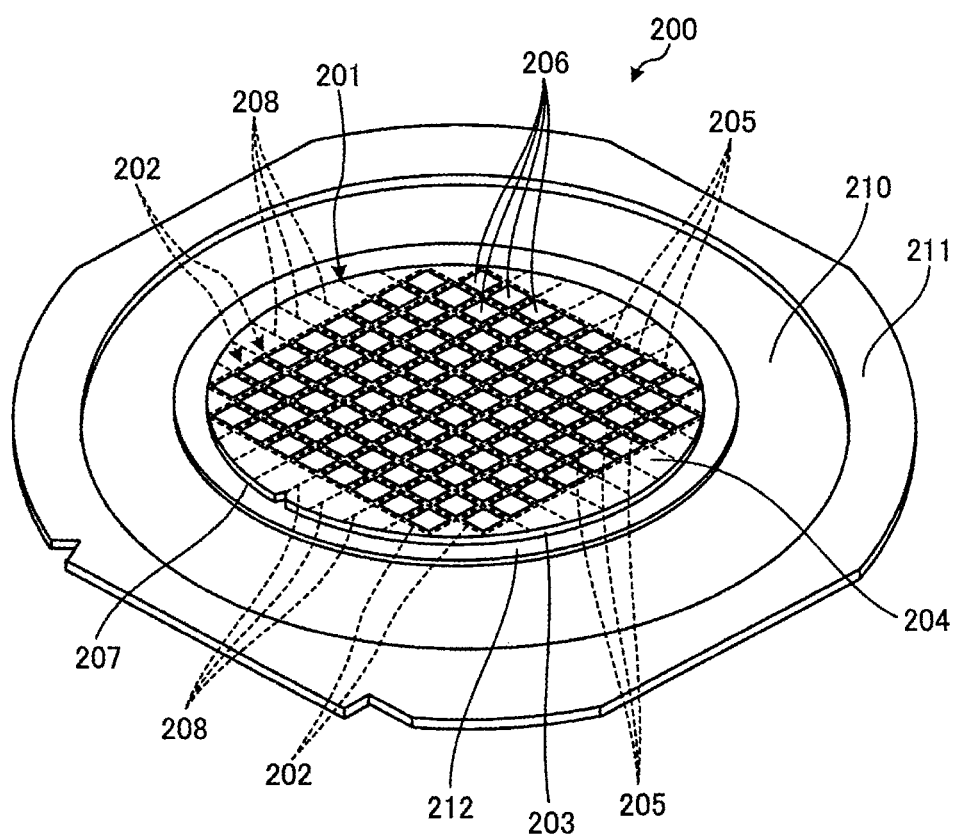
FIG. 1 is a perspective view illustrating one example of a workpiece unit that is a processing target of an expanding apparatus according to a first embodiment.
Figure 2:
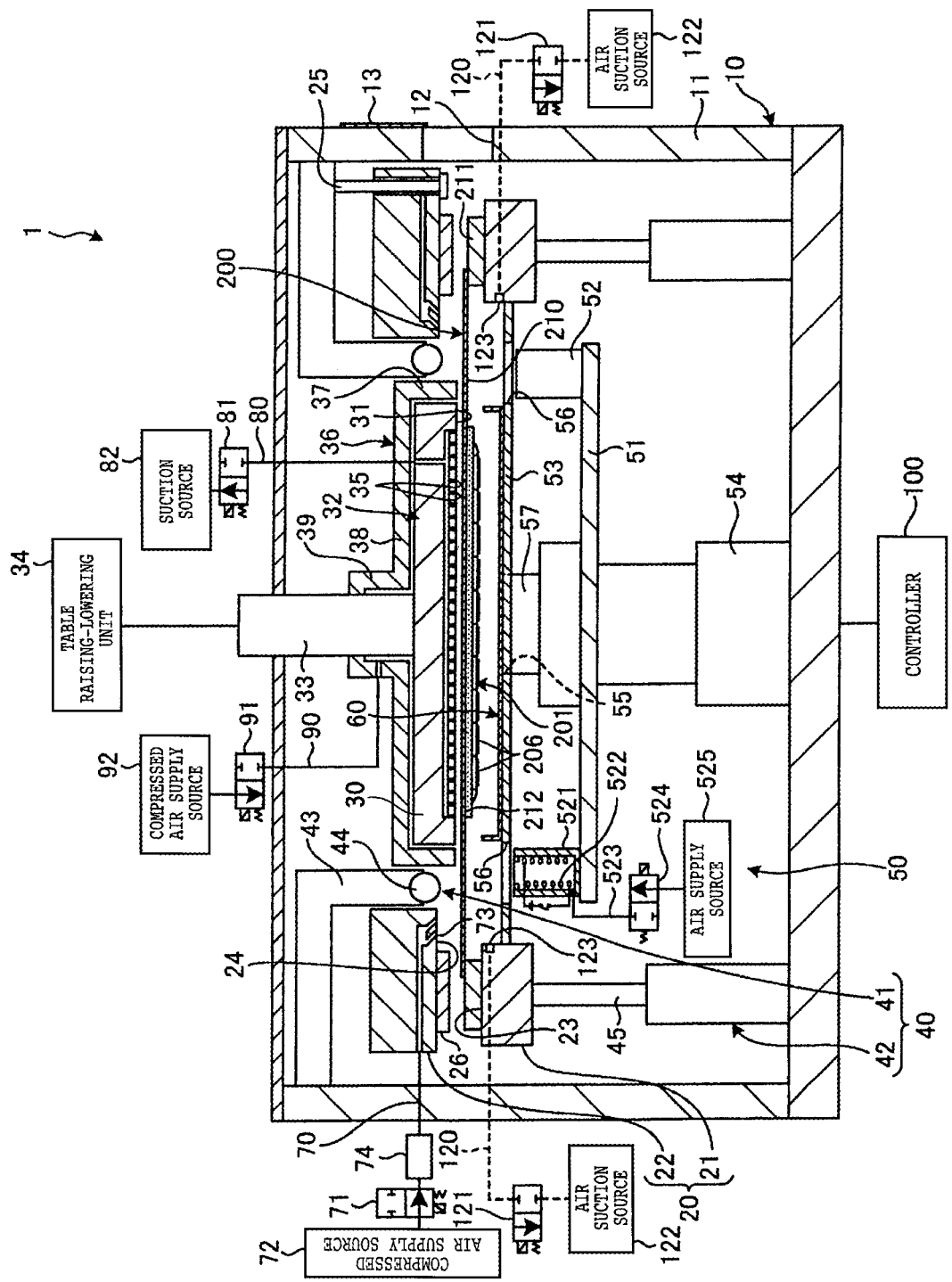
FIG. 2 is a sectional view schematically illustrating a configuration example of the expanding apparatus according to the first embodiment.
Figure 3:
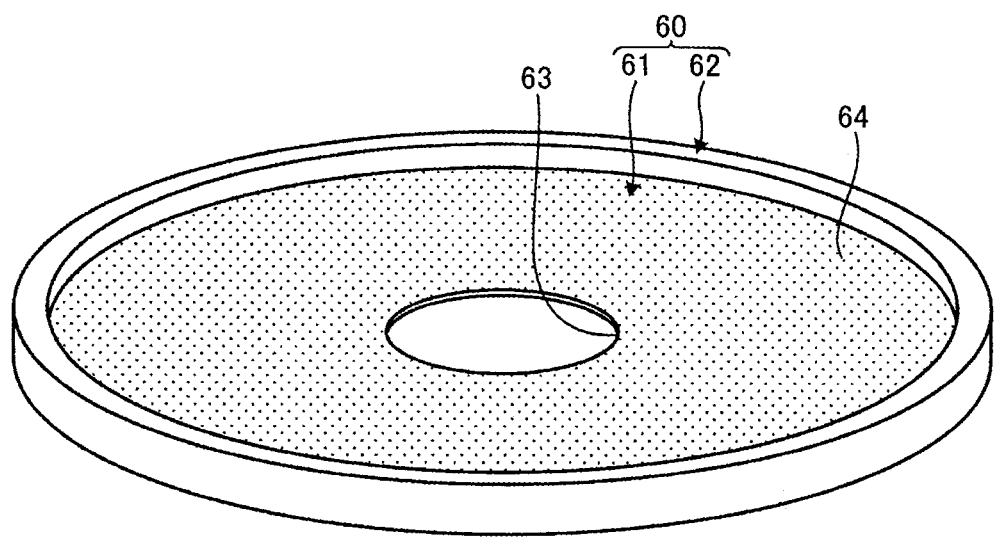
FIG. 3 is a perspective view schematically illustrating one example of a cover of the expanding apparatus illustrated in FIG. 2.
Figure 4:
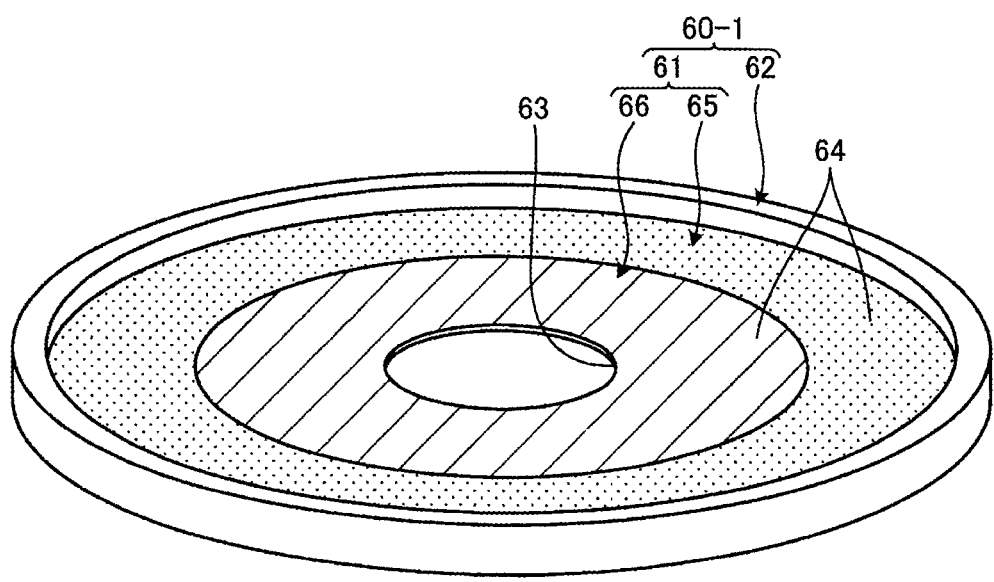
FIG. 4 is a perspective view schematically illustrating another example of the cover of the expanding apparatus illustrated in FIG. 2.

An expanding apparatus 1 according to a first embodiment of the present invention will be described based on the drawings. FIG. 1 is a perspective view illustrating one example of a workpiece unit 200 that is a processing target of the expanding apparatus 1 according to the first embodiment. FIG. 2 is a sectional view schematically illustrating a configuration example of the expanding apparatus 1 according to the first embodiment. FIG. 3 is a perspective view schematically illustrating one example of a cover 60 of the expanding apparatus 1 illustrated in FIG. 2. FIG. 4 is a perspective view schematically illustrating another example of the cover 60 of the expanding apparatus 1 illustrated in FIG. 2.

The expanding apparatus 1 according to the first embodiment is an apparatus that divides a workpiece 201 of the workpiece unit 200 illustrated in FIG. 1 into individual chips 202. In the first embodiment, as illustrated in FIG. 1, the workpiece unit 200 of a processing target includes the workpiece 201, a sheet 210 stuck to the workpiece 201, and an annular frame 211 to which the outer circumferential side of the sheet 210 is stuck.

The workpiece 201 is a wafer such as a circular plate-shaped semiconductor wafer or optical device wafer that employs silicon, sapphire, silicon carbide (Sic), gallium arsenide, or the like as a substrate 203. In the workpiece 201, as illustrated in FIG. 1, devices 206 are formed in respective regions marked out by plural planned dividing lines 205 that intersect each other in a front surface 204. For the workpiece 201, the sheet 210 is stuck to a back surface 207 on the back side of the front surface 204, and the annular frame 211 is stuck to the outer circumference of the sheet 210. Further, a laser beam with a wavelength having transmissibility with respect to the substrate 203 is applied to the workpiece 201 along the planned dividing lines 205 from the side of the back surface 207, and modified layers 208 that are the division start points along the planned dividing lines 205 are formed inside the substrate 203.

The workpiece 201 is divided into the individual chips 202 along the planned dividing lines 205 with use of the modified layers 208 as the division start points. The chips 202 include part of the substrate 203 and the device 206 formed on the front surface 204 of the substrate 203.

The modified layer 208 means a region in which the density, the refractive index, the mechanical strength, or another physical characteristic has become a different state from that of the surroundings, and a melting treatment region, a crack region, a dielectric breakdown region, a refractive index change region, a region in which these regions are mixed, and so forth can be cited as examples thereof.

The sheet 210 is formed into a circular plate shape with a diameter larger than the outer diameter of the workpiece 201 and is composed of a resin having expandability and shrinks when being heated, that is, has heat shrinkability. The sheet 210 is an expandable sheet in the first embodiment.

Further, in the first embodiment, in the workpiece unit 200, a die attach film (DAF) 212 with a circular plate shape is stuck between the back surface 207 of the substrate 203 of the workpiece 201 and the sheet 210. The DAF 212 is an adhesive film for die bonding for fixing the chip 202 to another chip, a substrate, or the like. In the first embodiment, the DAF 212 is formed into a circular plate shape having a diameter that is larger than the outer diameter of the workpiece 201 and is smaller than the inner diameter of the annular frame 211. The DAF 212 is divided for each of the individual chips 202. In the chips 202 after the dividing, the DAF 212 is stuck to the back surface 207 of the substrate 203 of the chips 202.

The expanding apparatus 1 according to the first embodiment is an apparatus that expands the sheet 210 of the workpiece unit 200 to divide the workpiece 201 into the individual chips 202 and to divide the DAF 212 for each chip 202. As illustrated in FIG. 2, the expanding apparatus 1 includes a chamber 10, a frame fixing part 20, a holding table 30, an expanding unit 40, a heating unit 50, the cover 60, and a controller 100.

The chamber 10 is formed into a box shape and houses the frame fixing part 20, the holding table 30, the expanding unit 40, and the heating unit 50. In the chamber 10, an opening 12 is made in a sidewall 11, and the workpiece unit 200 is carried out from and into the chamber 10 through the opening 12. The opening 12 is opened and closed by an opening-closing door 13.

The frame fixing part 20 is what holds and fixes the annular frame 211 of the workpiece unit 200. The frame fixing part 20 includes a frame support part 21 and a frame holding-down part 22 and clamps the annular frame 211 between the frame support part 21 and the frame holding-down part 22. The frame support part 21 is formed into a circular annular shape that has an inner diameter that is slightly smaller than the inner diameter of the annular frame 211 and is larger than the outer diameters of the workpiece 201 and the DAF 212 and has an outer diameter slightly larger than the outer diameter of the annular frame 211, and an upper surface 23 of the frame support part 21 is formed into a flat surface parallel to the horizontal direction. The annular frame 211 of the workpiece unit 200 is placed on the upper surface 23 of the frame support part 21.

Also, the frame support part 21 is disposed to be capable of moving in the vertical direction by cylinders 42 for raising and lowering the frame support part 21 in the expanding unit 40. The tips of rods 45 of the cylinders 42 are attached to the frame support part 21, and the frame support part 21 moves in the vertical direction in the chamber 10 through expansion and contraction of the rods 45. In the first embodiment, the frame support part 21 is raised by the cylinders 42 from a position at which the upper surface 23 of the frame support part 21 illustrated in FIG. 2 is substantially juxtaposed with the lower edge of the opening 12 in the horizontal direction.

The frame holding-down part 22 is formed into a circular annular shape that has an inner diameter that is smaller than the inner diameter of the frame support part 21 and is larger than the outer diameters of the workpiece 201 and the DAF 212 and has an outer diameter slightly larger than the outer diameter of the annular frame 211, and a lower surface 24 is formed into a flat surface parallel to the horizontal direction. The frame holding-down part 22 is disposed at such a position as to be coaxial with the frame support part 21 and, in the first embodiment, is disposed above the frame support part 21. In the first embodiment, the frame holding-down part 22 is supported to be capable of moving in the vertical direction by a slide support component 25 in the chamber 10, and the annular frame 211 is pressed by the frame support part 21 and raised and lowered, so that the frame holding-down part 22 can be fed in parallel with the frame support part 21.

In the frame fixing part 20, the annular frame 211 of the workpiece unit 200 inserted in the chamber 10 through the opening 12 is placed on the upper surface 23 of the frame support part 21 positioned on the lower side by the cylinders 42. In the frame fixing part 20, the frame support part 21 with the upper surface 23 on which the annular frame 211 is placed is raised by the cylinders 42, and the annular frame 211 and the outer circumferential side of the sheet 210 are clamped between the frame support part 21 and the frame holding-down part 22 to hold the annular frame 211. In addition, the frame support part 21 and the frame holding-down part 22 is raised from the position at which the annular frame 211 and the outer circumferential side of the sheet 210 are clamped. Also, in the first embodiment, in the frame fixing part 20, a seal component 26 that provides sealing between the sheet 210 and the annular frame 211 is attached across the whole circumference of the lower surface 24 of the frame holding-down part 22.

Moreover, in the first embodiment, on the inner circumferential side of the seal component 26 on the lower surface 24 of the frame holding-down part 22 of the frame fixing part 20, a compressed air outlet 73 to which compressed air is supplied from a compressed air supply source 72 through a supply path 70 provided inside the frame holding-down part 22, a vortex tube 74, and an opening-closing valve 71 is provided. The compressed air outlet 73 is provided across the whole circumference of the frame holding-down part 22 and prevents heat of hot air from transferring to the holding table 30 by formation of the flow of air by the compressed air.

Further, in the first embodiment, plural suction holes 123 that are connected to an air suction source 122 such as an ejector through a suction path 120 provided inside the frame support part 21 and an opening-closing valve 121 are opened on the upper side relative to a shutter plate 53 in the inner circumferential surface of the frame support part 21 of the frame fixing part 20. The suction holes 123 are not limited to the formation at such a position in the present invention and may be formed at any position such as in an inner circumferential surface or an upper surface of the frame fixing part 20 as long as they are formed on the side of a hot air jet part 52 relative to the sheet 210 of the workpiece unit 200 in which the annular frame 211 is held by the frame fixing part 20. Through suction of the suction holes 123 by the air suction source 122 through the suction path 120 and the opening-closing valve 121, the frame support part 21 can suck and capture mist, gas, and foreign matter such as dust (sheet dust) generated due to heating of the sheet 210 by the heating unit 50.

The holding table 30 includes an abutting surface 31 with a size corresponding to the workpiece 201 and abuts against the sheet 210 of the workpiece unit 200 including the annular frame 211 held by the frame fixing part 20. The holding table 30 has a table main body 32 with a thick circular plate shape, a cooling unit 33 that cools the table main body 32, and a table raising-lowering unit 34.

In the first embodiment, the table main body 32 is composed of an aluminum alloy and is formed with an outer diameter smaller than the inner diameter of the frame holding-down part 22 and is disposed at such a position as to be coaxial with the frame holding-down part 22 on the inner circumferential side of the frame holding-down part 22. A lower surface of the table main body 32 is the abutting surface 31 whose outer diameter corresponds to the outer diameter that is the size of the workpiece 201. In the first embodiment, the outer diameter of the table main body 32 is equal to the outer diameter of the DAF 212. Due to this, the outer diameter of the abutting surface 31 that is the lower surface of the table main body 32 corresponds to the outer diameter that is the size of the workpiece 201. The abutting surface 31 of the table main body 32 is opposed to the back surface 207 of the workpiece 201 with the interposition of the sheet 210 of the workpiece unit 200 in which the annular frame 211 is held by the frame fixing part 20 and the DAF 212.

Further, plural suction holes 35 that is connected to a suction source 82 such as an ejector through a suction path 80 provided in the table main body 32 and an opening-closing valve 81 are opened in the abutting surface 31 of the table main body 32. Through suction of the suction holes 35 by the suction source 82 through the suction path 80 and the opening-closing valve 81, the table main body 32 can suck and hold the side of the back surface 207 of the workpiece 201 on the abutting surface 31 with the interposition of the sheet 210 and the DAF 212.

In the first embodiment, the cooling unit 33 is disposed on a central part of an upper surface of the table main body 32 and cools the table main body 32, that is, the abutting surface 31. In the first embodiment, the cooling unit 33 is a piston cooler that can cool the table main body 32, but is not limited to the piston cooler in the present invention.

The table raising-lowering unit 34 is configured by a motor that is not illustrated, a ball screw that is rotated by the motor, and so forth and raises and lowers the table main body 32 and the cooling unit 33 in the chamber 10.

Moreover, in the first embodiment, the table main body 32 and the cooling unit 33 of the holding table 30 are covered by a table cover 36. The table cover 36 keeps cooling the table main body 32. In the first embodiment, the table cover 36 includes a large-diameter circular cylindrical part 37, a ring-shaped circular annular part 38, and a small-diameter circular cylindrical part 39, in an integrated manner. The large-diameter circular cylindrical part 37 covers an outer circumferential surface of the table main body 32 with an interval from the outer circumferential surface of the table main body 32 and has a circular cylindrical shape. The ring-shaped circular annular part 38 has an outer edge continuous with the large-diameter circular cylindrical part 37 and covers the upper surface of the table main body 32 with an interval from the upper surface of the table main body 32. The small-diameter circular cylindrical part 39 is continuous with an inner edge of the circular annular part 38 and covers an outer circumferential surface of the cooling unit 33 with an interval from the outer circumferential surface of the cooling unit 33 and has a circular cylindrical shape. The table cover 36 is disposed coaxially with the table main body 32 and the cooling unit 33. The table cover 36 is raised and lowered by the table raising-lowering unit 34 integrally with the table main body 32 and the cooling unit 33.

In the first embodiment, compressed air is supplied to between the holding table 30 and the table cover 36 from a compressed air supply source 92 through a supply path 90 and an opening-closing valve 91, and precludes hot air by the heating unit 50 from reaching the holding table 30 and prevents the holding table 30 from being heated.

The expanding unit 40 expands the sheet 210 stuck to the annular frame 211 held by the frame fixing part 20. The expanding unit 40 includes an expanding drum 41 fixed to the chamber 10 and the cylinders 42 for raising and lowering the frame support part 21.

The expanding drum 41 includes a circular cylindrical drum part 43. The drum part 43 is formed in such a manner that the inner diameter thereof is larger than the outer diameter of the large-diameter circular cylindrical part 37 of the table cover 36 and the outer diameter thereof is smaller than the inner diameter of the frame holding-down part 22. The drum part 43 is disposed on the outer circumferential side of the large-diameter circular cylindrical part 37 of the table cover 36 and on the inner circumferential side of the frame holding-down part 22 and is disposed coaxially with the frame fixing part 20 and the holding table 30. A circular columnar roller component 44 that is disposed on the same plane as the lower surface 24 of the frame holding-down part 22 located on the lower side and is disposed rotatably around the axial center is attached to the lower end of the expanding drum 41.

The heating unit 50 heats and shrinks the sheet 210 between the outer circumferential side of the workpiece 201 of the workpiece unit 200 that is held by the frame fixing part 20 and in which the sheet 210 has been expanded and the inner circumferential edge of the annular frame 211. The heating unit 50 includes a heater plate 51, plural hot air jet parts 52, and the shutter plate 53.

The heater plate 51 is formed into a circular plate shape and is disposed on the inner circumferential side of the frame support part 21 and coaxially with the cooling unit 33. The heater plate 51 has an upper surface parallel to the horizontal direction and is disposed on the lower side relative to the upper surface 23 of the frame support part 21 located on the lower side. The heater plate 51 is rotated around the axial center by a motor 54 for heater plate rotation attached to the chamber 10.

Figure 6:
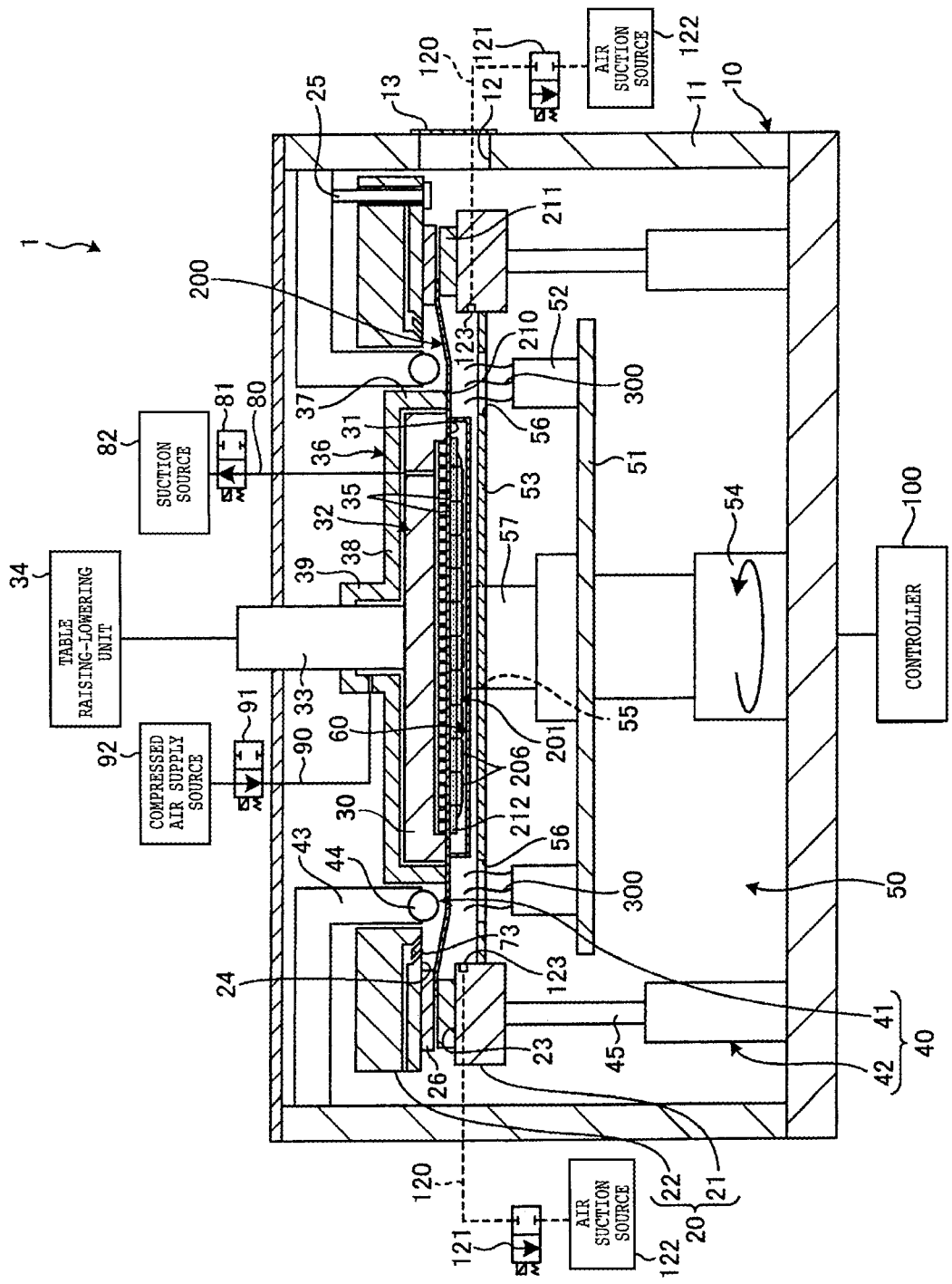
FIG. 6 is a sectional view schematically illustrating a state in which the sheet illustrated in FIG. 5 is heated and shrunk.

The plural hot air jet parts 52 face the sheet 210 between the outer circumferential side of the workpiece 201 of the workpiece unit 200 that is held by the frame fixing part 20 and in which the sheet 210 has been expanded and the inner circumferential edge of the annular frame 211 and jet hot air 300 (illustrated in FIG. 6). The plural hot air jet parts 52 are disposed at an outer edge part of the upper surface of the heater plate 51 at equal intervals in the circumferential direction and face the sheet 210 between the outer circumferential side of the workpiece 201 of the workpiece unit 200 that is held by the frame fixing part 20 and in which the sheet 210 has been expanded and the inner circumferential edge of the annular frame 211.

The hot air jet parts 52 each have a bottomed cylindrical jet part main body 521 having an upper part in which an opening part is provided, a coil heater 522 that is a heating part housed in the jet part main body 521, and an air supply source 525 that supplies air into the jet part main body 521 through a supply path 523 and an opening-closing valve 524. The coil heater 522 is supplied with power from a direct-current power supply through closing of a switch and generates heat. In the hot air jet parts 52, the air supply source 525 supplies air into the jet part main body 521 through opening of the opening-closing valve 524, and the supplied air is heated by the coil heater 522, so that the hot air 300 is jetted from the opening part.

The shutter plate 53 is formed into a circular disc shape whose outer diameter is slightly smaller than the inner diameter of the frame support part 21 and is disposed coaxially with the frame fixing part 20 and the cooling unit 33 over the hot air jet parts 52 and on the inner circumferential side of the frame support part 21. The outer circumferential surface of the shutter plate 53 is supported by the inner circumferential surface of the frame support part 21 and the shutter plate 53 is disposed to be capable of moving in the vertical direction together with the frame support part 21 by the cylinders 42. Alternatively, the shutter plate 53 may be fixed to not the frame support part 21 but a cylinder 57 and be disposed to be capable of moving in the vertical direction by the cylinder 57. Further, in the shutter plate 53, an opening 55 in which the cylinder 57 is inserted is provided at the center thereof, and opening parts 56 that can expose the hot air jet parts 52 are provided at an outer edge part thereof.

In this manner, in the expanding apparatus 1 according to the first embodiment, the holding table 30 is disposed over the workpiece unit 200 held by the frame fixing part 20, and the heating unit 50 is disposed under the workpiece unit 200.

The cover 60 covers the workpiece 201 of the workpiece unit 200 held on the holding table 30 when the sheet 210 is heated by the heating unit 50. As illustrated in FIG. 3, the cover 60 has an inner diameter larger than the outer diameters of the workpiece 201 and the DAF 212 and an outer diameter smaller than the inner diameter of the annular frame 211, and includes a circular plate part 61 and a circular annular protruding part 62 that is formed along the outer circumferential edge of the plate part 61. At the center of the plate part 61, an opening 63 in which the cylinder 57 attached to the upper side of the heater plate 51 is inserted to be fixed to the plate part 61 is formed. An opening or a hole is not formed in the other part of the plate part 61. A circular recess part 64 that hollows relative to the protruding part 62 is formed on an upper surface side of the plate part 61.

The cover 60 is disposed between the workpiece 201 of the workpiece unit 200 held by the frame fixing part 20 and the shutter plate 53 and is disposed coaxially with the frame fixing part 20 and the cooling unit 33. The cover 60 is disposed to be capable of moving in the vertical direction by the cylinder 57 for raising and lowering inserted in the opening 63 to be fixed.

Due to being disposed over the shutter plate 53, the cover 60 faces the workpiece 201 of the workpiece unit 200 held by the frame fixing part 20. The cover 60 is formed into a size corresponding to the workpiece unit 200 due to having an inner diameter larger than the outer diameters of the workpiece 201 and the DAF 212 and having an outer diameter smaller than the inner diameter of the annular frame 211. Also, the cover 60 is disposed on the inner circumferential side relative to the hot air jet parts 52 on the heater plate 51 due to having the outer diameter substantially equal to the outer diameter of the abutting surface 31 of the table main body 32 of the holding table 30.

In the first embodiment, when the cover 60 is raised from a retracted position on the shutter plate 53 by the cylinder 57 the cover 60 and the protruding part 62 comes contact with or close to the sheet 210 of the workpiece unit 200 held by the frame fixing part 20, the cover 60 houses the workpiece 201 of the workpiece unit 200 held by the frame fixing part 20 in the recess part 64. Through getting contact with or close to the sheet 210 of the workpiece unit 200 held by the frame fixing part 20 by the protruding part 62 as above, the cover 60 can prevent such a risk that the sheet 210 comes off the holding table 30. The cover 60 can prevent such a risk that generated sheet dust adheres to the workpiece 201 when the sheet 210 is heated by the heating unit 50 by housing and covering the workpiece 201 of the workpiece unit 200 held by the frame fixing part 20 in the recess part 64 as above.

In the first embodiment, in the example illustrated in FIG. 3, both the plate part 61 and the protruding part 62 of the cover 60 are formed of, for example, a material that has sufficiently low thermal conductivity and sufficient rigidity, for example, a resin. Thus, the cover 60 can prevent such a risk heat of the hot air 300 jetted by the hot air jet parts 52 transfers to the holding table 30 and the holding table 30 is heated, resulting in achieving reduction of the time for cooling the holding table 30 before expansion of the sheet 210 in order to increase the dividing rate of the DAF 212 when the next workpiece unit 200 is held on the holding table 30 and the DAF 212 is torn.

In the expanding apparatus 1 of the first embodiment, a cover 60-1 illustrated in FIG. 4 may be used instead of the cover 60 illustrated in FIG. 3. As illustrated in FIG. 4, the cover 60-1 is different from the cover 60 in the configuration of the plate part 61. In the cover 60-1, the plate part 61 has a circular annular outer circumferential plate part 65 formed of a material similar to that of the protruding part 62 and an inner circumferential plate part 66 that is disposed on the inner circumferential side of the outer circumferential plate part 65 and is formed of a material having higher rigidity than the outer circumferential plate part 65. In the cover 60-1, the opening 63 is formed at the center of the inner circumferential plate part 66. Also, the recess part 64 is formed as upper surfaces of the outer circumferential plate part 65 and the inner circumferential plate part 66 in the cover 60-1. The inner circumferential plate part 66 is formed of aluminum having higher rigidity than the resin, for example. Thus, the cover 60-1 prevents such a risk that the center of the recess part 64 bends into an upwardly-protruding shape and comes in contact with the workpiece 201 when a central part of the cover 60-1 is pushed up by the cylinder 57. Moreover, because the outer circumferential plate part 65 and the protruding part 62 are formed of a material with sufficiently low thermal conductivity similarly to the cover 60, the cover 60-1 can prevent heat of the hot air 300 jetted by the hot air jet parts 52 from transferring to the holding table 30, similarly to the cover 60, and the inner circumferential plate part 66 does not preclude this.

The controller 100 controls operation of the respective constituent elements of the expanding apparatus 1 and causes the expanding apparatus 1 to execute processing operation for the workpiece unit 200. The controller 100 includes a computer system in the first embodiment. The computer system included in the controller 100 is a computer having a calculation processing device having a microprocessor such as a central processing unit (CPU), a storing device having a memory such as a read only memory (ROM) or a random access memory (RAM), and an input-output interface device. The calculation processing device of the controller 100 executes calculation processing according to a computer program stored in the storing device of the controller 100 and outputs a control signal for controlling the expanding apparatus 1 to the respective constituent elements of the expanding apparatus 1 through the input-output interface device of the controller 100.

Figure 5:
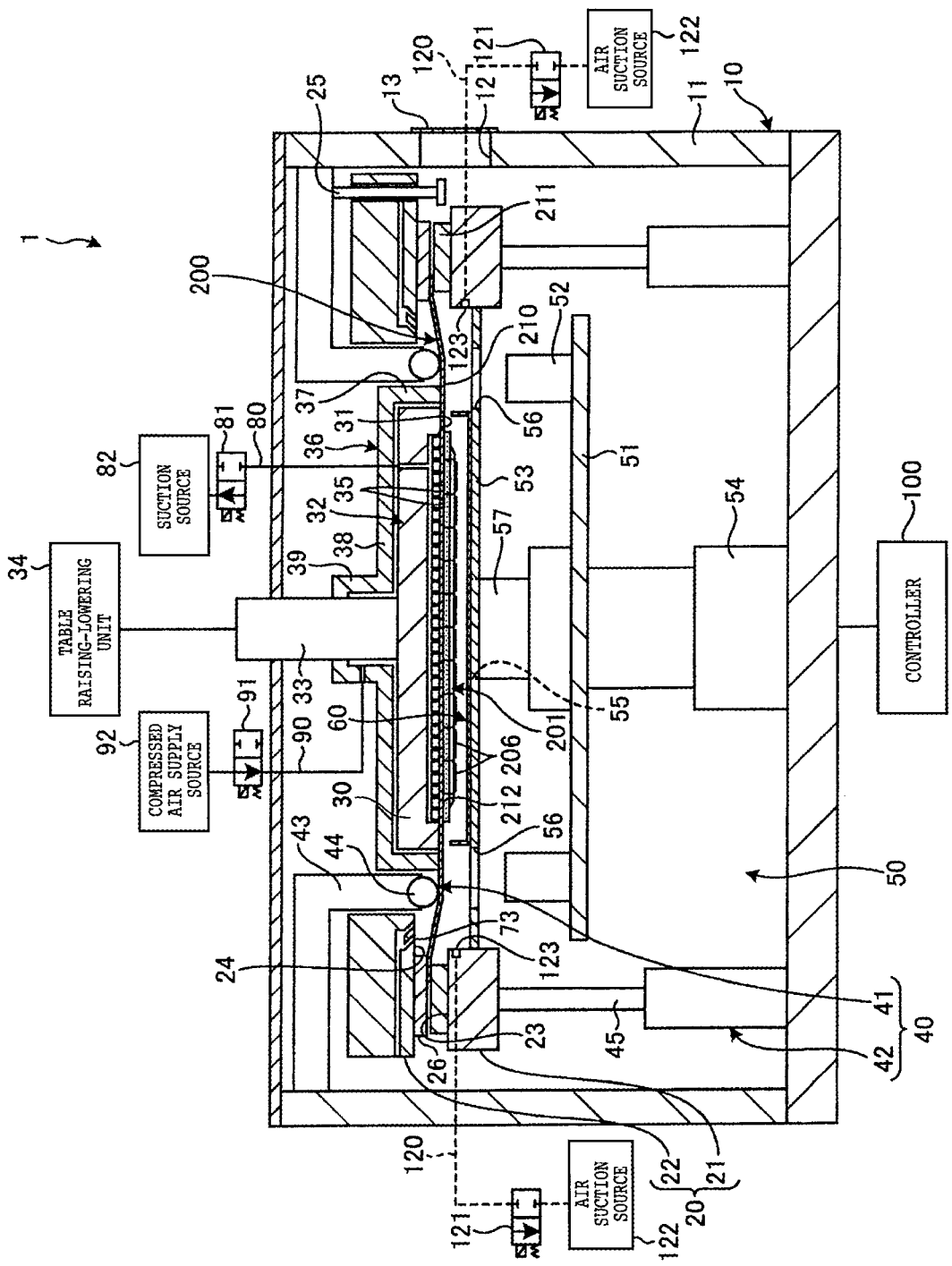
FIG. 5 is a sectional view schematically illustrating a state in which an annular frame of the workpiece unit is fixed to a frame fixing part of the expanding apparatus illustrated in FIG. 2 and a sheet is expanded.
Figure 7:
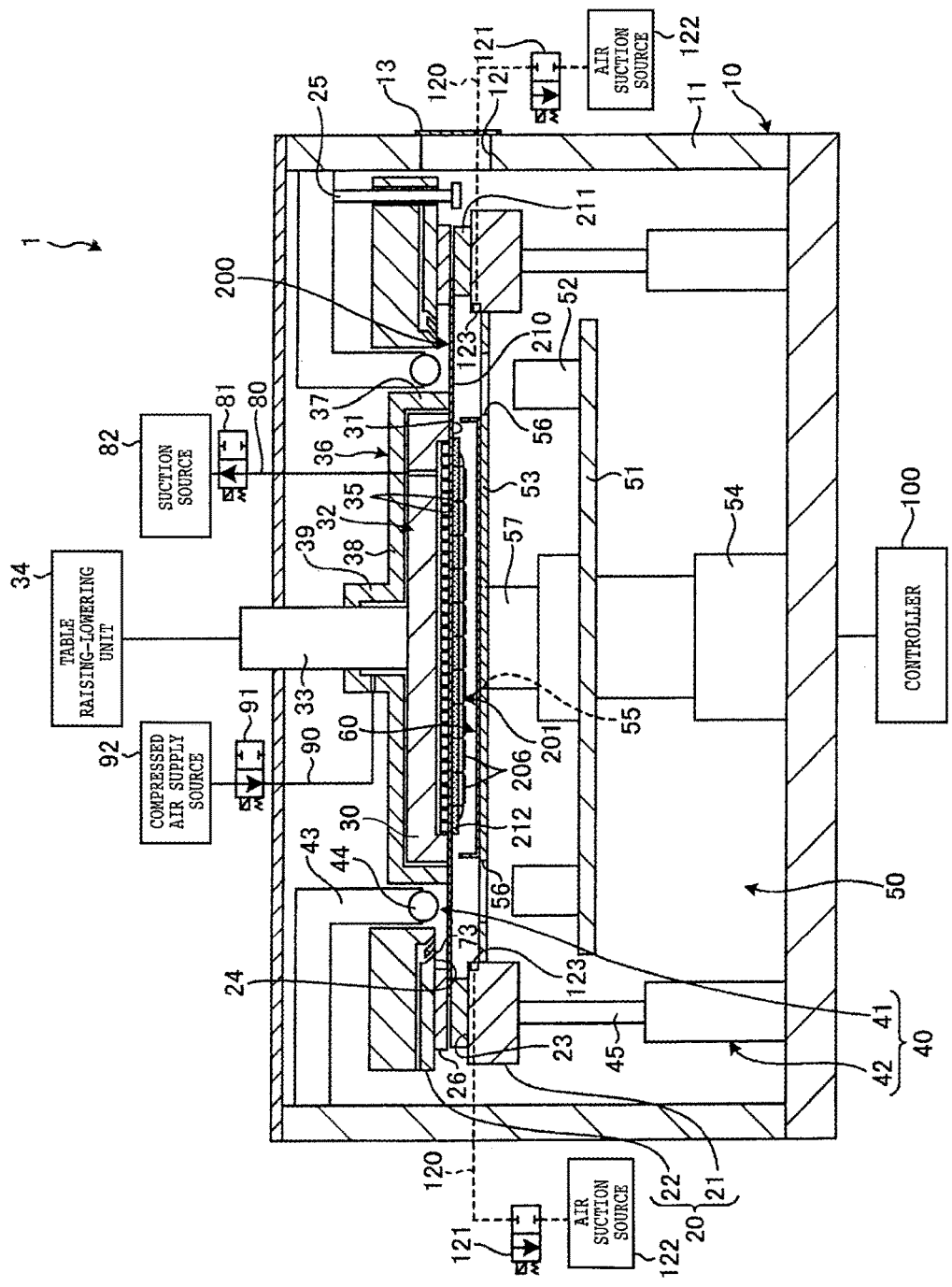
FIG. 7 is a sectional view schematically illustrating a state in which the expansion of the sheet illustrated in FIG. 6 has been eliminated.

Next, the present specification will explain the processing operation for the workpiece unit 200 by the expanding apparatus 1 according to the first embodiment with reference to the drawings. FIG. 5 is a sectional view schematically illustrating a state in which the annular frame 211 of the workpiece unit 200 is fixed to the frame fixing part 20 of the expanding apparatus 1 illustrated in FIG. 2 and the sheet 210 is expanded. FIG. 6 is a sectional view schematically illustrating a state in which the sheet 210 illustrated in FIG. 5 is heated and shrunk. FIG. 7 is a sectional view schematically illustrating a state in which the expansion of the sheet 210 illustrated in FIG. 6 has been eliminated.

The expanding apparatus 1 starts the processing operation when information on the contents of processing is registered in the controller 100 and an instruction to start processing is accepted. In the processing operation, the expanding apparatus 1 lowers the frame support part 21 and positions the abutting surface 31 of the table main body 32 of the holding table 30 to the upper side relative to the lower surface 24 of the frame holding-down part 22. The expanding apparatus 1 closes the opening-closing valves 71, 81, 91, 121, and 524 and cools the table main body 32 by the cooling unit 33. Further, the expanding apparatus 1 closes the switch to supply power from the direct-current power supply to the coil heaters 522, and opens the opening 12 by the opening-closing door 13 in a state in which the coil heaters 522 are caused to generate heat. In the expanding apparatus 1, the workpiece unit 200 is inserted into the chamber 10 through the opening 12, and, as illustrated in FIG. 2, the annular frame 211 of the workpiece unit 200 inserted into the chamber 10 is placed on the upper surface 23 of the frame support part 21.

The expanding apparatus 1 closes the opening 12 by the opening-closing door 13 and opens the opening-closing valves 71 and 91 to blow compressed air from the compressed air outlet 73 and supply compressed air from the compressed air supply source 92 to the table main body 32 and between the cooling unit 33 and the table cover 36 and cool the holding table 30. The expanding apparatus 1 extends the rods 45 of the cylinders 42 to raise the frame support part 21, and lowers the table main body 32 of the holding table 30 and so forth by the table raising-lowering unit 34. The expanding apparatus 1 may execute either one of extending the rods 45 of the cylinders 42 or lowering the table main body 32.

The expanding apparatus 1 clamps and holds the annular frame 211 and the outer circumferential side of the sheet 210 between the frame holding-down part 22 and the frame support part 21 located on the lower side. In addition, the expanding apparatus 1 positions the abutting surface 31 on the same plane as the lower surface of the seal component 26 to bring the abutting surface 31 close to the DAF 212 stuck to the sheet 210.

The expanding apparatus 1 further raises the frame support part 21 and raises the table main body 32 of the holding table 30 and so forth by the table raising-lowering unit 34 at a timing when the sheet 210 comes in contact with the abutting surface 31. When the sheet 210 comes in contact with the abutting surface 31, the DAF 212 is cooled by the cooling unit 33 through the sheet 210 and the table main body 32.

In the expanding apparatus 1, the frame holding-down part 22 is pressed by the annular frame 211, the frame support part 21, and so forth and is raised, and the lower surface 24 of the frame holding-down part 22 is raised to the upper side relative to the lower end of the roller component 44, and the abutting surface 31 of the table main body 32 of the holding table 30 is positioned on the same plane as the lower end of the roller component 44 by the table raising-lowering unit 34. Thereupon, as illustrated in FIG. 5, the sheet 210 of the workpiece unit 200 held by the frame fixing part 20 abuts against the roller component 44, and the sheet 210 is expanded in the planar direction. As a result of the expansion, a tensile force radially acts on the sheet 210.

When the tensile force radially acts on the sheet 210 stuck to the back surface 207 of the workpiece 201 as above, because the modified layers 208 are formed along the planned dividing lines 205, the workpiece 201 is divided into the individual chips 202 along the planned dividing lines 205 with the modified layers 208 being the starting point. Also, when the workpiece 201 is divided into the individual chips 202, a force in the expansion direction that acts from the sheet 210 concentrates between the chips 202 and the DAF 212 stuck to the back surface 207 of the workpiece 201 is divided for each of the individual chips 202. When completing the extension of the rods 45 of the cylinders 42, the expanding apparatus 1 opens the opening-closing valve 81 to suck and hold the workpiece 201, that is, the chips 202 individually divided, on the abutting surface 31 of the table main body 32 of the holding table 30 with the interposition of the sheet 210.

The expanding apparatus 1 contracts the rods 45 of the cylinders 42 to lower the frame support part 21 together with the frame holding-down part 22, and lowers the table main body 32 of the holding table 30 and so forth together with the frame support part 21 by the table raising-lowering unit 34. The expanding apparatus 1 closes the opening-closing valve 71 to stop the blowing of compressed air from the compressed air outlet 73.

As illustrated in FIG. 6, the expanding apparatus 1 raises the cover 60 by the cylinder 57 and brings the protruding part 62 into contact with the sheet 210 of the workpiece unit 200 held by the frame fixing part 20 and slightly presses the protruding part 62 toward the abutting surface 31 of the table main body 32 of the holding table 30. This causes the cover 60 to house the workpiece 201 of the workpiece unit 200 held by the frame fixing part 20 in the recess part 64 and separate the workpiece 201 housed in the recess part 64 from the outside of the recess part 64. Further, the expanding apparatus 1 opens the opening-closing valve 121 to start suction from the suction holes 123. Moreover, the expanding apparatus 1 opens the opening-closing valve 524 and rotates the heater plate 51 by the motor 54 for heater plate rotation while jetting the hot air 300 from the hot air jet parts 52.

Then, the sheet 210 gets separated from the roller component 44 along with lowering of the frame support part 21 and so forth. Thus, the expanding apparatus 1 blows the hot air 300 into a loosened part generated due to the expansion of the sheet 210 between the outer circumferential side of the workpiece 201 and the inner circumferential edge of the annular frame 211 across the whole circumference to heat and shrink the loosened part.

In the expanding apparatus 1, sheet dust is generated when the sheet 210 between the outer circumferential side of the workpiece 201 and the inner circumferential edge of the annular frame 211 is heated and shrunk. However, the cover 60 separates the outside of the recess part 64 and the inside of the recess part 64 in which the workpiece 201 of the workpiece unit 200 held by the frame fixing part 20 is housed. Therefore, the expanding apparatus 1 can prevent such a risk that the sheet dust adheres to the workpiece 201 by preventing entry of the sheet dust into the recess part 64 from the outside. Further, the expanding apparatus 1 prevents such a risk that the sheet 210 comes off the holding table 30 when the sheet 210 is heated and shrunk because the protruding part 62 of the cover 60 slightly presses the sheet 210 of the workpiece unit 200 held by the frame fixing part 20 toward the abutting surface 31 of the table main body 32 of the holding table 30. Moreover, the expanding apparatus 1 can further prevent a risk that the sheet dust adheres to the workpiece 201 through suction and capturing of the sheet dust by the suction holes 123 that are formed in the frame fixing part 20 and are connected to the air suction source 122.

When the contraction of the rods 45 of the cylinders 42 has been completed as illustrated in FIG. 7, the expanding apparatus 1 closes the opening-closing valves 81, 91, 121, and 524 and opens the opening 12 by the opening-closing door 13, and the workpiece unit 200 in which the workpiece 201 has been divided into the individual chips 202 and the DAF 212 has been divided for each of the individual chips 202 is carried out to the outside of the chamber 10. For the workpiece unit 200 in which the workpiece 201 has been divided into the individual chips 202 and the DAF 212 has been divided for each of the individual chips 202, the sheet 210 is heated and shrunk in a state of being sucked and held by the abutting surface 31 of the table main body 32 of the holding table 30 after expansion of the sheet 210. Therefore, rubbing of the divided chips 202 against each other can be prevented. Further, sequentially for plural workpiece units 200 successively, the expanding apparatus 1 repeats the steps illustrated in FIG. 2 and FIG. 5 to FIG. 7 to divide each of the workpieces 201 into the individual chips 202 and divide the DAF 212 for each of the individual chips 202.

The expanding apparatus 1 according to the first embodiment having the above-described configuration has the cover 60 that covers the workpiece 201 held on the holding table 30 and the cover 60 covers the workpiece 201 when the sheet 210 is heated by the heating unit 50. Thus, the cover 60 separates the outside of the recess part 64 from the inside of the recess part 64 in which the workpiece 201 of the workpiece unit 200 held by the frame fixing part 20 is housed and suppresses entry of sheet dust into the recess part 64 from the outside. This causes the expanding apparatus 1 according to the first embodiment to provide an advantageous effect capable of preventing such a risk that the sheet dust adheres to the workpiece 201.

Further, in the expanding apparatus 1 according to the first embodiment, the cover 60 is formed of a resin, which is a material with sufficiently low thermal conductivity. Thus, the cover 60 prevents heat of the hot air 300 jetted by the hot air jet parts 52 from transferring to the holding table 30. This causes the expanding apparatus 1 according to the first embodiment to provide an advantageous effect that it is possible to reduce the time taken for cooling the holding table 30 before processing of the next workpiece unit 200 due to heating of the holding table 30.

Moreover, the expanding apparatus 1 according to the first embodiment provides an advantageous effect that it is possible to prevent such a risk that the sheet 210 comes off the holding table 30 when the sheet 210 is heated and shrunk because the cover 60 has the plate part 61 and the protruding part 62 and the protruding part 62 comes in contact with the sheet 210 of the workpiece unit 200 held by the frame fixing part 20 and slightly presses the sheet 210 toward the abutting surface 31 of the table main body 32 of the holding table 30 when the sheet 210 is heated by the heating unit 50.

Further, the expanding apparatus 1 according to the first embodiment provides an advantageous effect capable of further preventing such a risk that the sheet dust adheres to the workpiece 201 because the suction holes 123 connected to the air suction source 122 are formed in the frame fixing part 20 and mist, gas, and foreign matter such as dust (sheet dust) generated due to heating of the sheet 210 by the heating unit 50 are sucked and captured by the suction holes 123.

Modification Example

An expanding apparatus 1-2 according to a modification example of the first embodiment of the present invention will be described based on the drawing. FIG. 8 is a sectional view schematically illustrating a configuration example of the expanding apparatus 1-2 according to the modification example of the first embodiment. In FIG. 8, the same part as the first embodiment is given the same numeral, and description thereof is omitted.

The expanding apparatus 1-2 according to the modification example of the first embodiment has the same configuration as the expanding apparatus 1 of the first embodiment except for the following points. The holding table 30 that does not have the table cover 36 and an expanding drum 41-2 are disposed under the workpiece unit 200 held by the frame fixing part 20, and the heating unit 50 is disposed over the workpiece unit 200, and the frame holding-down part 22 is fixed. Further, the expanding drum 41-2 is attached to rods 47 that extend in cylinders 46 for the drum and is raised together with the holding table 30 beyond the upper surface 23 of the frame support part 21 to expand the sheet 210.

Moreover, the suction holes 123 are formed on the lower side relative to the shutter plate 53 in the inner circumferential surface of the frame holding-down part 22 instead of the upper side relative to the shutter plate 53 in the inner circumferential surface of the frame support part 21. In FIG. 8, the chamber 10 is omitted.

The expanding apparatus 1-2 according to the modification example includes the cover 60 similar to that of the expanding apparatus 1 according to the first embodiment. Thus, similarly to the first embodiment, the expanding apparatus 1-2 provides, by the cover 60, advantageous effects capable of preventing such a risk that the sheet dust adheres to the workpiece 201, such a risk that the holding table 30 is heated, and such a risk that the sheet 210 comes off the holding table 30 when the sheet 210 is heated and shrunk.

Furthermore, the expanding apparatus 1-2 according to the modification example includes the suction holes 123 similar to those of the expanding apparatus 1 according to the first embodiment and therefore provides an advantageous effect capable of further preventing such a risk that the sheet dust adheres to the workpiece 201 by the suction holes 123 formed in the inner circumference of the frame holding-down part 22 in the frame fixing part 20, similarly to the first embodiment. The suction holes 123 may be formed at any position such as an inner circumferential surface or an upper surface of the frame fixing part 20 as long as they are formed on the side of the hot air jet part 52 relative to the sheet 210 of the workpiece unit 200 in which the annular frame 211 is held by the frame fixing part 20.

Second Embodiment

An expanding apparatus 1-3 according to a second embodiment of the present invention will be described based on the drawing. FIG. 9 is a sectional view schematically illustrating a configuration example of the expanding apparatus 1-3 according to the second embodiment. In FIG. 9, the same part as the first embodiment is given the same numeral, and description thereof is omitted.

The expanding apparatus 1-3 according to the second embodiment is different from the expanding apparatus 1 according to the first embodiment in that the cover 60 has a cover suction hole 67, as illustrated in FIG. 9, and the other configuration is similar to that of the expanding apparatus 1 according to the first embodiment. The cover suction hole 67 is formed at such a position as to avoid the opening 63 in which the cylinder 57 is inserted to be fixed (in the example illustrated in FIG. 9, on the near side of the plane of paper of FIG. 9 relative to the opening 63) in the plate part 61, and is connected to a suction source 69 such as an ejector through a suction path 68 and an opening-closing valve 68-2.

In the cover 60 of the second embodiment, the cover suction hole 67 is formed in the flat plate part 61. However, the configuration is not limited thereto in the present invention, and the plate part 61 may be inclined in such a direction as to lower toward the cover suction hole 67.

Next, the present specification will explain processing operation for the workpiece unit 200 by the expanding apparatus 1-3 according to the second embodiment with reference to the drawing. As illustrated in FIG. 9, when causing the sheet 210 of the workpiece unit 200 held by the frame fixing part 20 to abut against the roller component 44 and expanding the sheet 210 in the planar direction, the expanding apparatus 1-3 raises the cover 60 by the cylinder 57 and positions the protruding part 62 to a position at which an appropriate gap 220 from the sheet 210 is made without causing the protruding part 62 to come in contact with the sheet 210 of the workpiece unit 200 held by the frame fixing part 20, and introduces a negative pressure from the suction source 69 into the recess part 64 through the cover suction hole 67. As a result, the expanding apparatus 1-3 forms the flow of air that goes from the gap 220 toward the inside of the recess part 64 and collects, from the cover suction hole 67, minute dust such as chip dust and tape dust that are possibly generated due to expansion of the sheet 210. Here, the chip dust is dust generated when the workpiece 201 is divided into the individual chips 202, and the tape dust is dust generated when the DAF 212 is divided for each of the individual chips 202. This causes the expanding apparatus 1-3 to prevent such a risk that minute dust such as the chip dust and the tape dust that may possibly be generated due to expansion of the sheet 210 float and adhere to the workpiece 201 again after dropping downward.

The expanding apparatus 1-3 according to the second embodiment having the above-described configuration is different from the expanding apparatus 1 according to the first embodiment in that the cover 60 has the cover suction hole 67 connected to the suction source 69 such as an ejector through the suction path 68 and the opening-closing valve 68-2, and therefore, naturally provides advantageous effects similar to those of the first embodiment. Further, because the cover 60 has the cover suction hole 67, the expanding apparatus 1-3 according to the second embodiment can further collect, from the cover suction hole 67, minute dust such as the chip dust and the tape dust that may possibly be generated due to expansion of the sheet 210 by introducing a negative pressure from the suction source 69 into the recess part 64 through the cover suction hole 67 when the sheet 210 is expanded. This causes the expanding apparatus 1-3 according to the second embodiment to further provide an advantageous effect capable of preventing such a risk that minute dust such as the chip dust and the tape dust that may possibly be generated due to expansion of the sheet 210 float and adhere to the workpiece 201 again after dropping downward.

The present invention is not limited to the above-described embodiments. That is, the present invention can be carried out with various modifications without departing from the range of the gist of the present invention. In the first and second embodiments, the frame holding-down part 22 of the frame fixing part 20 is disposed to be capable of moving in the vertical direction. However, the frame holding-down part 22 of the frame fixing part 20 may be fixed to the chamber 10 in the present invention.

Moreover, in the first and second embodiments, the example in which the modified layers 208 that are the division start points are formed in the workpiece 201 along the planned dividing lines 205 has been described. However, in the present invention, the configuration is not limited to the formation of the modified layers 208. In the present invention, before expansion by the expanding apparatus 1, 1-2, or 1-3, the workpiece 201 may be divided into the individual chips 202 along the planned dividing lines 205 through execution of cutting processing or laser ablation processing for the workpiece 201 or processing grooves that are recessed from the front surface 204 may be formed along the planned dividing lines 205 through execution of cutting processing or laser ablation processing for the workpiece 201. Moreover, in the first and second embodiments, the workpiece unit 200 includes the workpiece 201 and the DAF 212. However, in the present invention, the configuration is not limited thereto and what includes one of the workpiece

201 and the DAF 212 and does not include the other may be employed as the workpiece unit 200.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An expanding apparatus that expands a sheet of a workpiece unit including a workpiece, the sheet stuck to the workpiece, and an annular frame to which an outer circumferential side of the sheet is stuck, the expanding apparatus comprising:
   a frame fixing part that fixes the annular frame of the workpiece unit;
   a holding table that holds the workpiece;
   an expanding unit that expands the sheet;
   a heating unit that heats the sheet between an outer circumferential side of the workpiece and an inner circumferential edge of the annular frame; and
   a cover that covers the workpiece held on the holding table,
   wherein the cover covers the workpiece when the sheet is heated by the heating unit.

2. The expanding apparatus according to claim 1, wherein a suction hole connected to an air suction source is formed in the frame fixing part, and
   the suction hole sucks sheet dust generated due to heating of the sheet.

3. The expanding apparatus according to claim 1, wherein the cover has a cover suction hole connected to a suction source.

* * * * *